US006730945B2

United States Patent
Chaki

(10) Patent No.: US 6,730,945 B2
(45) Date of Patent: May 4, 2004

(54) SEMICONDUCTOR DEVICE

(75) Inventor: Shin Chaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/194,223

(22) Filed: Jul. 15, 2002

(65) Prior Publication Data

US 2003/0057436 A1 Mar. 27, 2003

(30) Foreign Application Priority Data

Sep. 26, 2001 (JP) ........................................ 2001-294556

(51) Int. Cl.[7] ................................................ H01L 29/49
(52) U.S. Cl. .................... 257/159; 257/194; 330/277; 330/286
(58) Field of Search ............................... 257/159, 194; 330/277, 286

(56) References Cited

U.S. PATENT DOCUMENTS

| 5,065,117 | A | * | 11/1991 | Yoshimasu | 333/33 |
| 5,087,893 | A | * | 2/1992 | Petersen et al. | 330/296 |
| 5,160,984 | A | * | 11/1992 | Mochizuki et al. | 257/277 |
| 5,283,452 | A | * | 2/1994 | Shih et al. | 257/277 |
| 5,546,049 | A | * | 8/1996 | Wen et al. | 330/277 |
| 5,786,737 | A | * | 7/1998 | Goto | 333/33 |
| 5,793,253 | A | * | 8/1998 | Kumar et al. | 330/124 |
| 5,945,700 | A | * | 8/1999 | Mizutani | 257/259 |
| 6,114,923 | A | * | 9/2000 | Mizutani | 333/103 |
| 6,181,205 | B1 | * | 1/2001 | Loval et al. | 330/277 |
| 6,313,677 | B1 | * | 11/2001 | Okayasu | 327/170 |
| 6,342,815 | B1 | * | 1/2002 | Kobayashi | 330/286 |
| 6,380,787 | B1 | * | 4/2002 | Forbes | 327/292 |
| 6,421,390 | B1 | * | 7/2002 | Burkhart | 375/257 |
| 6,472,941 | B2 | * | 10/2002 | Shigematsu | 330/286 |

FOREIGN PATENT DOCUMENTS

| EP | 1 217 725 | * | 6/2002 |
| JP | 3-136401 | * | 6/1991 |
| JP | 5-129854 | | 5/1993 |
| JP | 11-74703 | * | 3/1999 |
| JP | 2002-33627 | * | 1/2002 |

* cited by examiner

Primary Examiner—Nathan J. Flynn
Assistant Examiner—Ahmed N. Sefer
(74) Attorney, Agent, or Firm—Leydig, Voit & Mayer, Ltd.

(57) ABSTRACT

Three or more MESFETs are fabricated side by side on a semiconductor chip. A transmission line substantially identical in width with an area within which the MESFETS are fabricated is formed in parallel with the row of MESFETs. The MESFETs are connected to the transmission line at a side, constituting one edge of the transmission line. Further, regulation circuits are connected in shunt with the transmission line, and outputs of the MESFESTS are merged while being matched by the transmission line and the regulation circuits.

4 Claims, 5 Drawing Sheets

SEMICONDUCTOR DEVICE

BACKGROUND OF THE INVENTION

1. Field of the Invention

The present invention relates to a power amplifier for use with an RF signal, such as a power amplifying MMIC (microwave monolithic integrated circuit). More specifically, the invention relates to a power merging circuit fabricated on a semiconductor chip.

2. Background Art

An increase in the output of a power amplifier for use with an RF signal has recently been pursued. Included among MMICs operating at a range of 20 to 40 GHz is one which produces an output of 1W or more. In a final output stage of such a high-output RF power amplifier, four or more active elements are connected in shunt with each other. FIG. 9 is a view showing an output merging section of a conventional power amplifier. Four active elements 2 are connected together by means of transmission lines, and outputs are merged into a single output. As illustrated, a mainstream method for merging outputs from active elements is connecting active elements with transmission lines according to a tournament method.

In the case of an MMIC used in a communications device for microwaves/millimeter waves, cost-cutting owing to a reduction in the size of a chip is important. However, as shown in FIG. 9, connection of active elements based on the tournament method encounters difficulty in miniaturizing a circuit. Although not shown in FIG. 9, in an actual circuit a bias voltage must be applied to each of the active elements 2. A bias circuit is usually known to have a short stub of $\lambda/4$, provided that a signal frequency is taken as $\lambda$. For this reason, if an attempt is made to achieve commonality of wiring so that a bias voltage can be applied to one external terminal, the area of a circuit is increased, and the wiring becomes complicated. Particularly, in the case of an inter-stage circuit of a multi-stage amplifier, there is also a necessity for use of a circuit for distributing an input to the next stage, in addition to a power merging circuit and a bias commonality circuit in a preceding stage. As a result, the circuit becomes more complicated, inevitably leading to an increase in the area of the circuit.

The present invention provides a compact power amplifier having a simple circuit configuration for solving the problem.

SUMMARY OF THE INVENTION

In one embodiment of the present invention, a semiconductor device has three or more amplifying circuits which amplify power by means of active elements and a merging circuit for merging outputs from the amplifying circuits, wherein the merging circuit is constituted of an integral distributed constant line and a plurality of regulation circuits connected in parallel with the distributed constant line, and the respective amplifying circuits are connected to the distributed constant line by way of a side constituting one edge of the distributed constant line.

Each of the amplifying circuits is preferably constituted of only the active element. The regulation circuit is preferably a short stub.

The active element is, for example, a MESFET or HEMT. A gate width of the MESFET or HEMT is determined on the basis of a distance from nodes provided along the side by way of which the MESFET or HEMT is connected, to the distributed constant line, to the side of the distributed constant line.

In another embodiment of the present invention, a semiconductor device comprises a plurality of power amplifiers connected in series and/or parallel with each other. The power amplifier has three or more amplifying circuits which amplify power by means of active elements and a merging circuit for merging outputs from the amplifying circuits, wherein the merging circuit is constituted of an integral distributed constant line and a plurality of regulation circuits connected in parallel with the distributed constant line, and the respective amplifying circuits are connected to the distributed constant line by way of a side constituting one edge of the distributed constant line.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

First Embodiment

Figure 1:
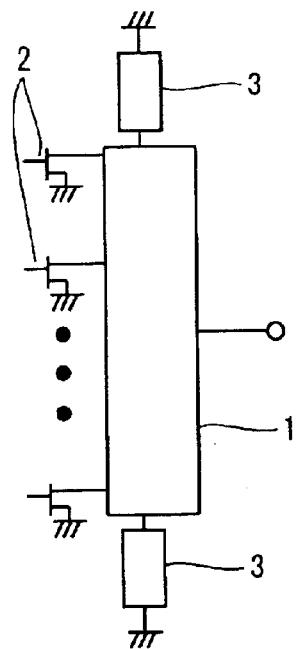
FIG. 1 shows a circuit configuration of a semiconductor device according to a first embodiment of the invention.

FIG. 1 is a view showing a circuit configuration of a semiconductor device according to a first embodiment of the invention. The circuit comprises MESFETs 2 arranged into a plurality of rows; an integral transmission line 1 which is substantially identical in width with an area within which the MESFETs 2 are placed (the vertical direction in the drawing represents a width, and the horizontal direction represents a length); and regulation circuits 3 connected in shunt with the transmission line 1. As illustrated, the MESFETs 2 and the transmission line 1 are connected with each other along a side constituting one edge of the transmission line 1. In general, a standard 50-ohm transmission line to be formed on a gallium arsenide (GaAs) substrate of 100 μm thickness has a width of about 70 μm. However, the transmission line 1 has a width of hundreds to thousands of micrometers. For instance, when four standard-sized MESFETs 2 are arranged side by side, the transmission line 1 assumes a width of about 800 μm.

By means of the configuration, the MESFETs 2 act as amplifier circuits, and the transmission line 1 and the regulation circuits 3 act as a merging circuit. The amplifying circuit may be constituted of the MESFETs 2 and peripheral circuits connected in series therewith. In terms of a reduction in the area of the amplifying circuit, the amplifying circuit is preferably constituted of only the MESFETs 2. The transmission line 1 is at one end thereof connected to the MESFETs 2, thereby merging outputs from the MESFETs 2. The transmission line 1 plays a role of matching the outputs from the MESFETs 2, by means of an internal impedance of the transmission line 1 and impedances of the regulation circuits 3.

According to a conventional tournament connection method, output terminals of all MESFETS are connected to a transmission line of identical width, thus uniformly drawing power from all the MESFETs. However, according to the configuration shown in FIG. 1, connection of output terminals of MESFETs differ from one MESFET to another MESFET. The MESFETs 2 connected to the neighborhoods of lateral ends of the transmission line 1 cannot be said to be identical with that connected to a position close to the center of the transmission line 1, in terms of connection status. Providing the electronic circuit with a parallel circuit has been empirically determined to be an effective measure for alleviating such inconsistencies in an electronic circuit. The regulation circuits 3 are provided for this reason. Hence, detailed configurations of the regulation circuits 3, such as capacitance, inductance, and resistance, are to be determined through simulation so that sufficient outputs can be drawn from MESFETs.

In the embodiment, the regulation circuits 3 acts as a circuit for alleviating the inconsistencies and also as a bypass circuit. Hence, the regulation circuits 3 are grounded. However, there is no necessity for grounding the regulation circuits 3. In one conceivable case, the regulation circuits 3 may be embodied as, e.g., open stubs. So long as the regulation circuits 3 are embodied as doubling as bypass circuits, the number of elements constituting a circuit can be diminished. In terms of a reduction in the area of the circuit, the circuit configuration shown in FIG. 1 is desirable. Although the embodiment employs MESFETs as active elements, HEMTs may be employed.

As mentioned above, the circuit has a simple structure, in which the MESFETs 2 are connected in shunt with each other to one edge of the wide transmission line 1. The circuit does not employ a combination of a plurality of distributed constant circuits, which has hitherto been employed, and outputs are merged by means of one transmission line. Hence, the circuit has a small area. Output terminals of MESFETs are directly connected with each other by means of the transmission line 1. The transmission line 1 acts as a common line, thereby obviating a necessity for use of a plurality of bias circuits. As a result of the merging circuit having been constituted in such a configuration, the overall area of the circuit can be reduced, thereby enabling provision of a compact semiconductor chip.

The circuit configuration of the embodiment yields an advantage of the ability to facilitate a change in frequency characteristic of an entire circuit. In the case of the foregoing circuit configuration, the frequency characteristic (i.e., a mean frequency) of the entire circuit is highly dependent on the characteristic impedance of the transmission line 1. The characteristic impedance of the transmission line 1 can be readily changed, by means of changing the thickness of a dielectric substrate on which the transmission line is patterned. A change in the thickness of the substrate does not involve a change in the pattern formed on the surface of the substrate, thus obviating a necessity for changing a mask pattern. Further, there is also obviated a necessity for changing the size of a chip or the position of a die pad, and hence a peripheral substrate on which a chip is to be mounted may be subjected to minimum changes.

Second Embodiment

Figure 2:
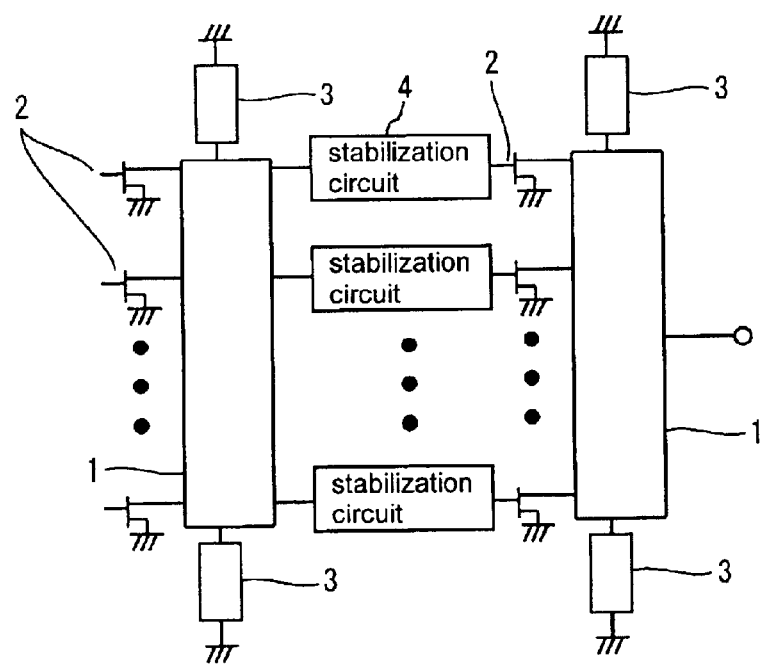
FIG. 2 shows a circuit configuration of a semiconductor device according to a second embodiment.

The first embodiment has described a circuit for merging final outputs of power amplifiers. However, needless to say, the invention can be applied to an inter-stage circuit to be interposed between amplifiers provided in a plurality of stages. An embodiment shown in FIG. 2 relates to an example of a two-stage amplifier. A first stage of the amplifier is constituted of a plurality of MESFETs 2, the transmission line 1, and the regulation circuits 3. A second stage of the amplifier is constituted of a plurality of stabilization circuits 4, the MESFETs 2, the transmission line 1, and the regulation circuits 3. In the case of a multi-stage amplifier, stabilization circuits and gate-bias application circuits must be provided between stages. In the case of the configuration of a circuit in the second stage, the circuitry formed by a combination of the stabilization circuits 4 and the MESFETs 2 corresponds to an amplifying circuit according to the invention.

Third Embodiment

The present embodiment focuses attention on a difference in reflection coefficient of the transmission line 1 in terms of the output terminals of the MESFETs 2. The embodiment relates to an example in which the configuration of a regulation circuit is determined so as to mitigate inconsistencies in outputs from the MESFETs stemming from a difference in reflection coefficient in the transmission line 1.

Figure 3:
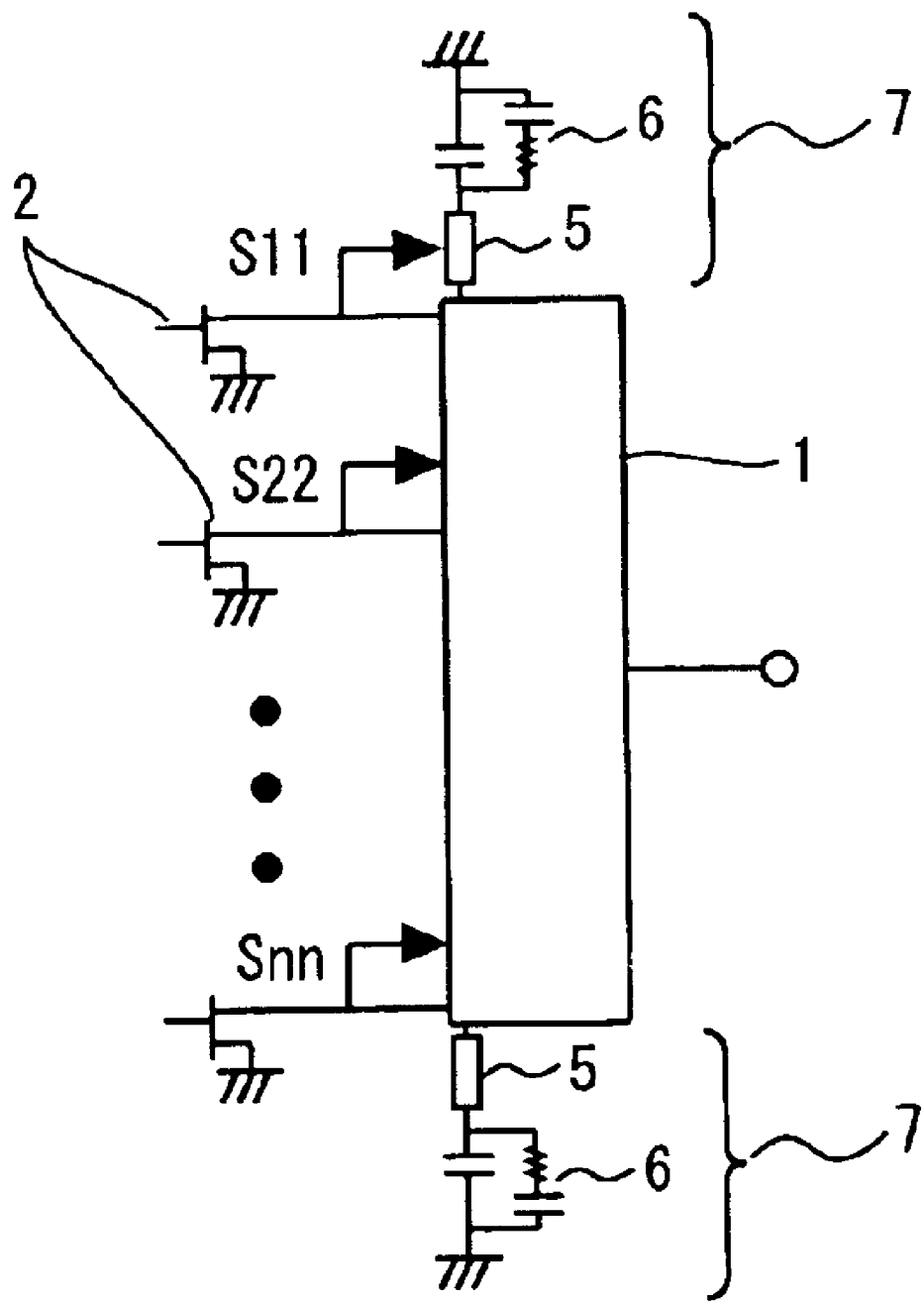
FIG. 3 shows a circuit configuration of a semiconductor device according to a third embodiment.

As shown in FIG. 3, in the embodiment, transmission lines 5 (stubs) are grounded by way of capacitors and resistors 6 and taken as short stubs 7. In the drawing, reference symbol Sii ("i"=1 through "n") represents a reflection coefficient of the transmission line 1 when viewed from the respective MESFETs 2. Thus, the reflection coefficient obtained in the vicinity of the lateral end of the transmission line 1 differs from that obtained in the center of the same. When the short stubs 7 are not available, the power drawn from the MESFETs becomes inconsistent.

Figure 4:
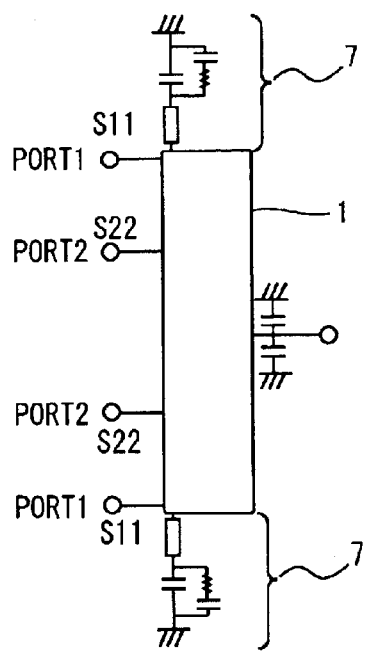
FIG. 4 shows a case where four MESFETs are connected to the circuit shown in FIG. 3.
Figure 5:
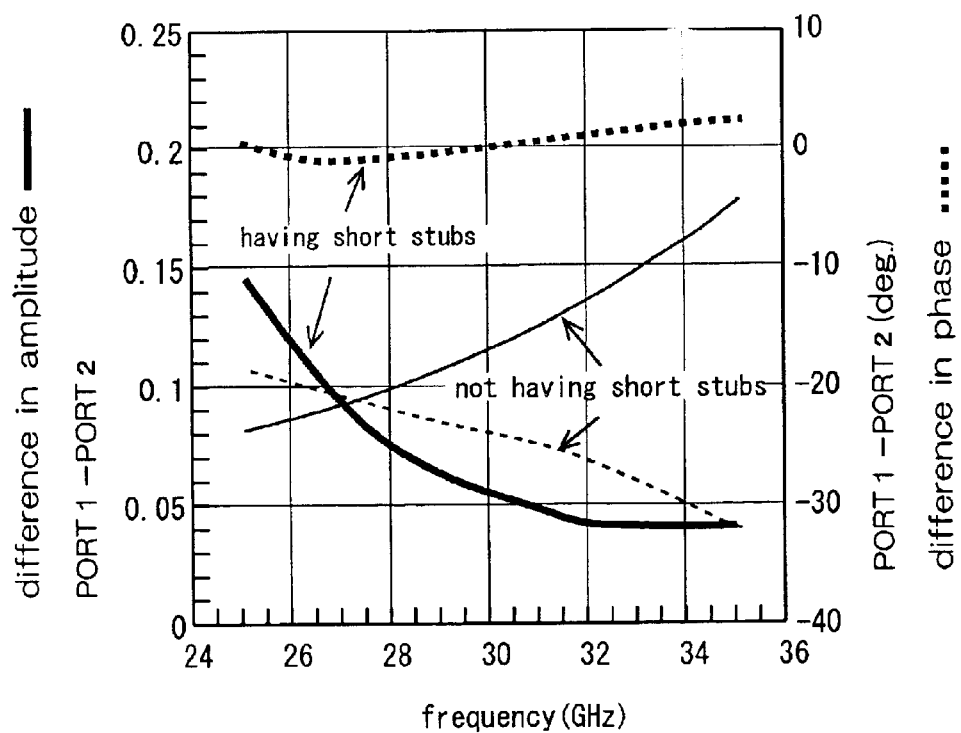
FIG. 5 is a graph representing a difference in amplitude and phase of reflected waves obtained at the PORT1 and the PORT2 of the circuit shown in FIG. 4.

FIG. 4 and FIG. 5 are drawings to show that inconsistencies in power are mitigated by the short stubs 7. FIG. 4 shows a case where four MESFETs are connected to the circuit shown in FIG. 3. When attention is focused on the MESFETs and the respective connection ports, a reflection coefficient S11 of a PORT1 located in the vicinity of a lateral end of the transmission line 1 differs from a reflection coefficient S22 of a PORT2 located in the center of the transmission line 1. FIG. 5 shows a graph representing a difference in an amplitude and phase of a reflected wave obtained at the PORT1 of the circuit shown in FIG. 4 and an amplitude and phase of a reflected wave obtained at the PORT 2 of the same, wherein a horizontal axis represents a frequency. A solid line represents a difference in amplitude, and broken lines represents a difference in phase. Further, a bold line indicates a circuit having short stubs, and a narrow line indicates a circuit not having short stubs. As represented by graphs, by means of addition of the short stubs 7, a difference in amplitude is reduced to about one-half, and a phase difference is reduced to substantially zero. Thus, by means of the short stubs 7, inconsistencies in output are mitigated, and uniform power can be drawn from the respective MESFETs.

Fourth Embodiment

Figure 6:
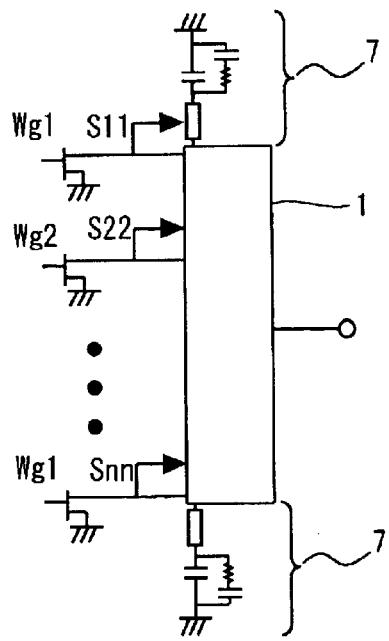
FIG. 6 shows a circuit configuration of a semiconductor device according to a fourth embodiment.

A fourth embodiment of the invention is identical in circuit configuration with the third embodiment, except that the MESFETs have different gate widths. As shown in FIG. 6, a gate width $Wg_1$ of MESFETs connected to the lateral ends of the transmission line 1 is made different from a gate width $Wg_2$ of the MESFETs connected to the center of the transmission line 1. Phases of output waveforms of the MESFETs are intentionally changed, thereby mitigating inconsistencies in output from the PORTS 1 and 2. As in the case of the third embodiment, uniform power can be drawn from each of the MESFETs.

Fifth Embodiment

Figure 7:
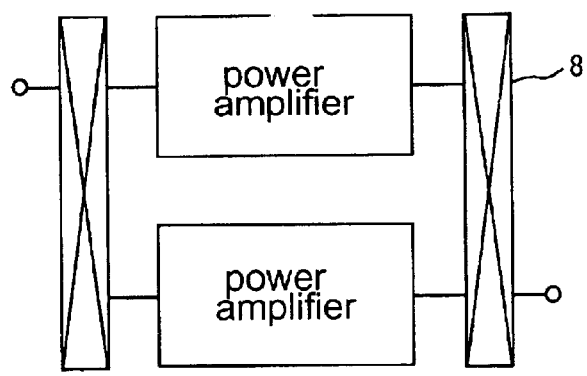
FIG. 7 shows a circuit configuration of a semiconductor device according to a fifth embodiment (parallel connection)
Figure 8:
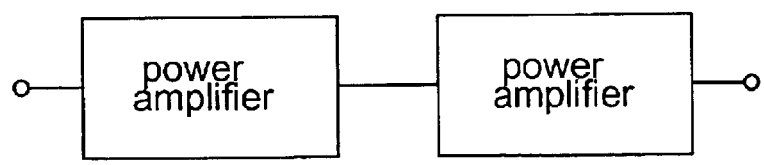
FIG. 8 shows a circuit configuration of a semiconductor device according to a fifth embodiment (series connection)
Figure 9:
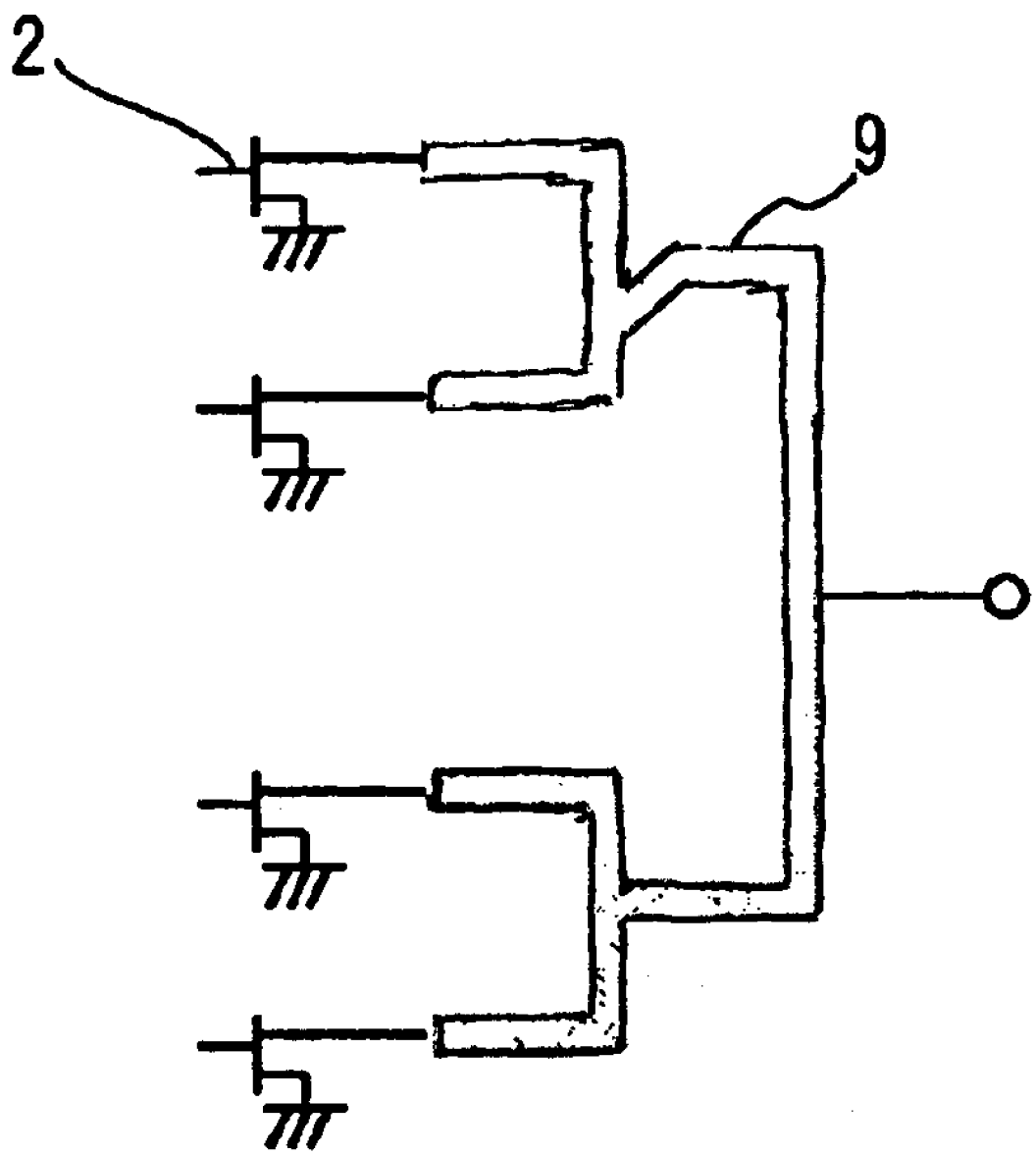
FIG. 9 is a view showing an output merging section of a conventional power amplifier.

FIGS. 7 and 8 show the configuration of a circuit formed by a combination of a plurality of power amplifiers described in connection with the first through fourth embodiments. As mentioned above, a basic circuit is of simple structure and has a small area. Therefore, a combination of amplifiers is simpler than that employed in the conventional art.

If power amplifiers are connected in parallel to each other with a coupler 8, a compact semiconductor device having a high-power power amplifying function can be embodied. In contrast, if the power amplifiers are connected in series with each other, as shown in FIG. 8, a compact semiconductor device having a higher-gain power amplifying function can be embodied.

In a semiconductor device according to the invention, outputs from a plurality of active elements are merged together while being matched by means of an integral distributed constant line and a plurality of regulation circuits. Even when three or more active elements are available, the circuit can be suppressed to a small area. Thus, there is no necessity of achieving commonality of bias lines, and hence wiring becomes simple.

In the semiconductor device according to the invention, regulation circuits of power amplifiers are taken as short stubs, and gate widths of transistors are adjusted, to thereby draw uniform and sufficient power from all the active elements and to provide a high-power, high-gain power amplifying function.

Since the circuit of the power amplifier is of simple structure and has a small area, a plurality of amplifiers can be combined together readily. The semiconductor device according to the invention provides a high-power, high-gain power amplifying function by means of connecting a plurality of power amplifiers in parallel or series or connecting three or more power amplifiers in series or parallel.

It is further understood that the foregoing description is a preferred embodiment of the disclosed apparatus and that various changes and modifications may be made in the invention without departing from the spirit and scope thereof.

The entire disclosure of a Japanese Patent Application No.2001-294556, filed on Sep. 26, 2001 including specification, claims drawings and summary, on which the Convention priority of the present application is based, are incorporated herein by reference in its entirety.

I claim:

1. A semiconductor device comprising:
   at least three amplifying circuits with respective active elements, each active element being selected from the group consisting of MESFETs and HEMTs, for amplifying; and
   a merging circuit for merging outputs from the amplifying circuits, wherein
      the merging circuit includes an integral distributed constant line and a plurality of regulation circuits connected in parallel to the distributed constant line,
      the respective amplifying circuits are connected to the distributed constant line at a side, constituting one edge, of the distributed constant line, and
      each of the respective active elements has a gate width determined based on distance from respective nodes along the side of the distributed constant line where the respective active elements are connected to the distributed constant line, to an end of the distributed constant line to which one of the regulation circuits is connected.

2. The semiconductor device according to claim 1, wherein each of the amplifying circuits is only the active element.

3. The semiconductor device according to claim 1, wherein each of the regulation circuits is a short-circuited stub.

4. The semiconductor device according to claim 1 wherein the transmission line has only a single output and the single output is located centrally along the second edge of the transmission line.

* * * * *